(12) United States Patent
Basker et al.

(10) Patent No.: US 11,189,693 B2
(45) Date of Patent: Nov. 30, 2021

(54) TRANSISTOR HAVING REDUCED CONTACT RESISTANCE

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 186 days.

(21) Appl. No.: 16/401,226

(22) Filed: May 2, 2019

(65) Prior Publication Data

US 2020/0350403 A1 Nov. 5, 2020

(51) Int. Cl.

| H01L 29/08 | (2006.01) |
|---|---|
| H01L 29/10 | (2006.01) |
| H01L 29/78 | (2006.01) |
| H01L 29/417 | (2006.01) |
| H01L 29/40 | (2006.01) |
| H01L 21/306 | (2006.01) |
| H01L 29/66 | (2006.01) |
| H01L 29/45 | (2006.01) |

(52) U.S. Cl.
CPC .... *H01L 29/0847* (2013.01); *H01L 21/30604* (2013.01); *H01L 29/1037* (2013.01); *H01L 29/401* (2013.01); *H01L 29/41741* (2013.01); *H01L 29/456* (2013.01); *H01L 29/6656* (2013.01); *H01L 29/66666* (2013.01); *H01L 29/7827* (2013.01)

(58) Field of Classification Search
CPC ........... H01L 29/0847; H01L 21/30604; H01L 29/1037; H01L 29/401; H01L 29/41741; H01L 29/456; H01L 29/6656; H01L 29/66666; H01L 29/7827; H01L 29/78642
See application file for complete search history.

(56) References Cited

U.S. PATENT DOCUMENTS

| 9,570,356 B1 * | 2/2017 | Balakrishnan .... H01L 29/42356 |
| 9,647,123 B1 | 5/2017 | Balakrishnan et al. |
| 9,735,253 B1 | 8/2017 | Bi et al. |
| 2014/0001561 A1 * | 1/2014 | Cheng ............. H01L 21/823814 257/369 |

(Continued)

OTHER PUBLICATIONS

"Low Contact Resistance Top S/D for VTFET", IP.com Prior Art Database Technical Disclosure, 2018; 7 pages.

*Primary Examiner* — Peter Bradford
(74) *Attorney, Agent, or Firm* — Cantor Colburn LLP; Randall Bluestone

(57) ABSTRACT

An integrated semiconductor device having a substrate, a bottom source or drain (S/D) structure formed on the substrate. In addition, the device includes a fin extending from the bottom S/D structure and a gate formed around the fin. A top S/D structure is formed on top of the fin. The top S/D structure includes a recessed top S/D surface and a silicide layer covering a top portion of the recess. A contact is communicatively coupled to a surface of the silicide layer of the recessed top S/D surface of the top S/D structure.

14 Claims, 5 Drawing Sheets

(56) References Cited

U.S. PATENT DOCUMENTS

| | | | |
|---|---|---|---|
| 2015/0069582 A1* | 3/2015 | Kim | H01L 29/0847 |
| | | | 257/622 |
| 2016/0013292 A1 | 1/2016 | Choi | |
| 2016/0315172 A1 | 10/2016 | Wu et al. | |
| 2017/0012126 A1 | 1/2017 | Chu-Kung et al. | |
| 2017/0162446 A1* | 6/2017 | Balakrishnan | H01L 21/3081 |
| 2018/0061967 A1 | 3/2018 | Bi et al. | |
| 2018/0204950 A1 | 7/2018 | Cheng et al. | |
| 2018/0204951 A1 | 7/2018 | Cheng et al. | |
| 2018/0240873 A1* | 8/2018 | Cheng | H01L 29/7827 |
| 2020/0135920 A1* | 4/2020 | Kong | H01L 29/0847 |

* cited by examiner

US 11,189,693 B2

TRANSISTOR HAVING REDUCED CONTACT RESISTANCE

BACKGROUND

The present invention generally relates to fabrication methods and resulting structures for semiconductor devices. More specifically, the present invention relates to a transistor device having a reduced contact resistance.

Vertical field-effect transistors (VFETs) are a promising non-planar transistor architecture for beyond 5 nm complementary metal-oxide-semiconductor (CMOS) technology. VFETs have recently been developed to achieve a reduced field-effect transistor (FET) device footprint without compromising necessary FET device performance characteristics. VFETs employ semiconductor fins and side-gates that can be contacted outside the active region, resulting in increased device density and performance over lateral devices.

In VFET devices, in contrast to conventional FETs, the source to drain current flows through a vertical pillar in a direction that is perpendicular with respect to a horizontal major surface of the wafer or substrate. A VFET can achieve a smaller device footprint because its channel length is decoupled from the contacted gate pitch.

In VFET devices, metal semiconductor alloys, such as for example, metal silicides are used to reduce contact resistance between a metal structure (i.e., a metal contact) and a semiconductor region such as a source region, a drain region, and a gate conductor line.

SUMMARY

According to a non-limiting embodiment of the present invention, an integrated semiconductor device is provided that includes a substrate, a bottom source or drain (S/D) structure formed on the substrate. In addition, the device includes a fin extending from the bottom S/D structure and a gate formed around the fin. A top S/D structure is formed on top of the fin. The top S/D structure includes a recessed top S/D surface and a silicide layer covering a top portion of the recessed top S/D surface. A contact communicatively coupled to a surface of the silicide layer of the recessed top S/D surface of the top S/D structure.

Embodiments of the present invention are further directed to a method for fabricating an integrated semiconductor device. A non-limiting example of the method includes providing a substrate and forming a bottom source or drain (S/D) structure on the substrate. In addition, the method includes forming a fin extending from the bottom S/D structure and forming a gate around the fin. Further, the method includes forming a top S/D structure on top of the fin and forming a recessed top S/D surface and a silicide layer covering a top portion of the recessed top S/D surface on the top S/D structure. The method even further provides for forming a contact that is communicatively coupled to a surface of the silicide layer of the recessed top S/D surface of the top S/D structure.

According to yet another non-limiting embodiment, a method of fabricating an integrated semiconductor device includes providing a substrate and forming a vertical field effect transistor (VFET) on the substrate. The VFET includes a top source or drain (S/D) structure formed on top of a fin channel. The top S/D structure has a V-shape recessed top S/D surface. The VFET further includes a contact communicatively coupled to a surface of the V-shape recessed top S/D surface of the top S/D structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings.

FIGS. 1-4 depict cross-sectional views of a semiconductor device after fabrication operations for forming an IC with vertical field effect transistors (VFETs) having an increased contact surface area in accordance with aspects of the invention, in which:

FIG. 1 depicts a cross-sectional view illustrating a structure that results from performing initial fabrication operations in accordance with embodiments of this invention;

FIG. 2 depicts a cross-sectional view illustrating fabrication operations in accordance with embodiments of the invention;

FIG. 3 depicts a cross-sectional view illustrating fabrication operations in accordance with embodiments of the invention; and FIG. 4 depicts a cross-sectional view illustrating fabrication operations in accordance with embodiments of the invention.

FIGS. 5-9 depict cross-sectional views of a semiconductor device after fabrication operations for forming an IC having a M-shaped contact surface area in accordance with aspects of the invention, in which:

FIG. 5 depicts a cross-sectional view illustrating a structure that results from performing initial fabrication operations in accordance with embodiments of this invention;

FIG. 6 depicts a cross-sectional view illustrating fabrication operations in accordance with embodiments of the invention;

FIG. 7 depicts a cross-sectional view illustrating fabrication operations in accordance with embodiments of the invention;

FIG. 8 depicts a cross-sectional view illustrating fabrication operations in accordance with embodiments of the invention; and FIG. 9 depicts a cross-sectional view illustrating fabrication operations in accordance with embodiments of the invention.

Figure 2:
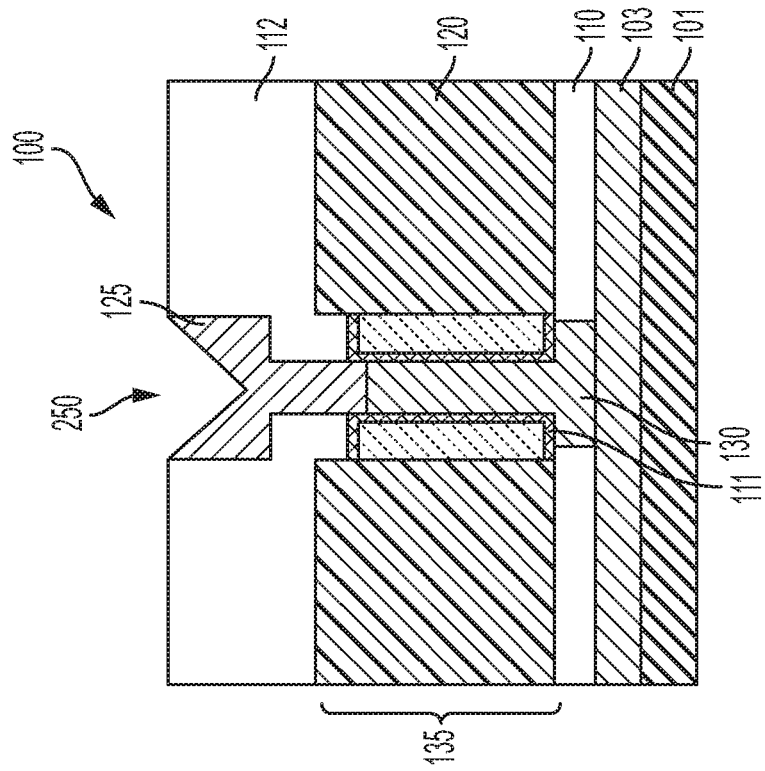

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

VFETs are a promising non-planar transistor architecture for beyond 5 nm complementary metal-oxide-semiconductor (CMOS) technology. VFET have recently been developed to achieve a reduced field-effect transistor (FET) device footprint without compromising necessary FET device performance characteristics. More specifically, VFETs are one of the alternatives to standard lateral (or planar) FET structures due to benefits, among others, in terms of reduced device footprint. In this type of structure, the current flow is perpendicular to a supporting wafer, rather than a lateral current flow of, for example, fin-based FETs. Moreover, a VFET can achieve a smaller device footprint because its channel length is decoupled from the contacted gate pitch.

However, there are challenges to providing VFETs with equal or superior performance characteristics to lateral devices. For example, VFETs generally exhibit higher contact resistance due to decreased surface area of the contact between a metal layer and the underlying semiconductor material than standard lateral (or planar) FETs. As the dimensions of VFETs scale down, the total area available for forming a metal semiconductor alloy (e.g., metal silicide) per contact is reduced. Accordingly, the contact resistance of a metal semiconductor alloy region between a metal contact via and an underlying semiconductor region becomes significant with the scaling of VFETs. In other words, the reduction in the available area per contact limits the volume of the metal semiconductor alloy region that can be formed, and thereby raises the contact resistance of the metal semiconductor alloy region with the scaling down of VFETs. A high contact resistance of the metal semiconductor alloy region adversely impacts device performance by introducing extra parasitic resistance. A large contact resistance can limit performance parameters of VFET devices. Reducing contact resistance can greatly improve the performance of VFETs. Thus, a method and structure is desired for reducing the contact resistance by increasing the surface area of the contact between a metal layer and the underlying semiconductor material.

Turning now to an overview of the aspects of the invention, one or more embodiments of the invention address the above-described shortcomings of the prior art by providing a VFET device with a contact surface area between a contact and a top source and drain (S/D) region that is increased as compared to the contact surface area of a standard VFET. More specifically, according to embodiments of the present invention an increased contact surface area is provided between the contact and the top S/D structure due to the V-shaped recess region in the S/D structure, and thereby reducing contact resistance of the device.

Figure 1:
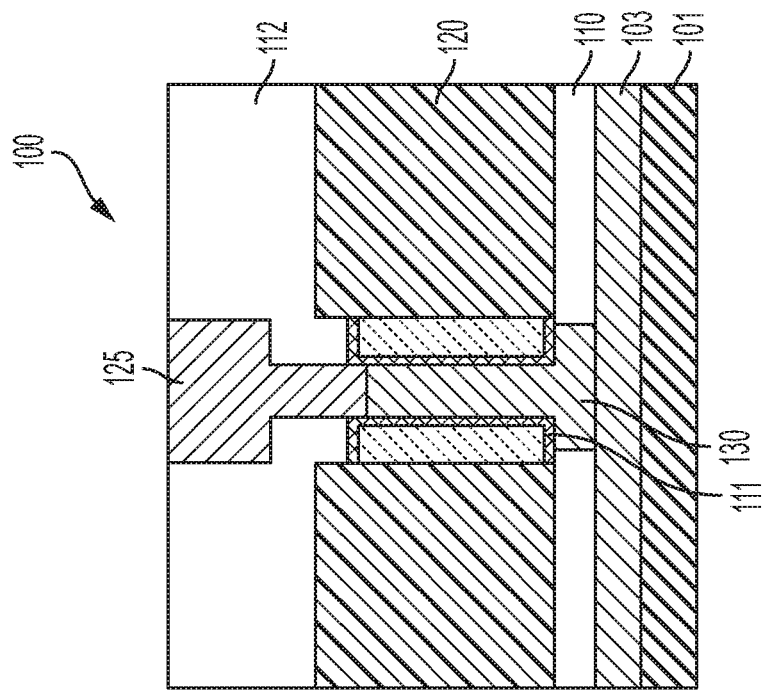

Turning now to a more detailed description of aspects of the present invention, FIGS. 1-4 depict cross-sectional views of a portion of semiconductor structure 100 after fabrication operations for forming an IC with VFETs having an increased contact surface area in accordance with aspects of the invention. Referring initially to FIG. 1, there is shown a cross-sectional view of the semiconductor structure 100 after known fabrication operations are used to form a semiconductor substrate 101 with a bottom S/D structure 103 formed on top of the semiconductor substrate 101. A fin 130 (channel) extends vertically from the bottom S/D structure 103 and is surrounded by a gate stack 135. The fin 130 can include a hard mask (not shown) on top of the fin 130 formed by any known semiconductor fabrication method (e.g., chemical vapor deposition (CVD) or physical vapor deposition (PVD). The gate stack 135 includes a metal gate 120. The gate stack 135 can also include a dielectric layer 111 made of, for example, a high-k dielectric. Gate spacers 110, 112 are formed on opposing sides of the gate 120. The first gate spacer 110 is formed between the gate stack 135 and the bottom S/D structure 103. The second gate spacer 112 is arranged on top of the gate stack 135. A top S/D structure 125 can be formed by known fabrication operations, for example, in-situ doped epitaxial processing.

The substrate 101 can include one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The fin 130 can be formed in the substrate 101 by know fabrication processes, for example, depositing and patterning a hard mask material over the substrate 101. The fin 130 can be patterned in the substrate 101 by, for example, sidewall imaging transfer. The fin 130 extends vertically from the substrate 101 and the bottom S/D structure 103.

The bottom S/D structure 103 is formed in the substrate 101 under the fin 130. The bottom S/D structure 102 can be formed by known fabrication operations, for example, depositing an epitaxial layer onto the substrate 101. Alternatively, the bottom S/D structure 103 can be formed by incorporating dopants into the substrate 101. Epitaxial growth can be grown using, for example, vapor-phase epitaxy (VPE), molecular-beam epitaxy (MBE), liquid-phase epitaxy (LPE), or other suitable process. The epitaxial silicon, silicon germanium, and/or carbon doped silicon (Si:C) can be doped during deposition by adding a dopant or impurity during or after epitaxy.

The top S/D structure 125 can be formed by known fabrication operations, for example, epitaxial growth such as VPE, MBE, or LPE. The suitable materials for the top S/D structure 125 can be silicon, silicon germanium, and/or carbon silicon (Si:C). The top S/D structure 125 can be doped during deposition by adding a dopant or impurity during or after epitaxy.

The gate stack 135 is formed on the bottom S/D structure 102 and around the fin 130. The dielectric layer 111 can be a dielectric material having a dielectric constant greater than 3.9, 7.0, or 10.0, for example oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The dielectric layer 111 can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric layer 111 can vary depending on the deposition process as well as the composition and number of dielectric materials used.

The metal gate 120 of the gate stack 135 can include one or more metal layers. The metal gate 135 can include a work function metal arranged on the dielectric layer 111. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The conductive gate metal can then be deposited on the work function metal. Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering.

The first gate spacer 110 and the second gate spacer 112 can include any suitable dielectric material or a combination of multiple dielectric materials. The spacer material can include silicon, oxygen, nitrogen, carbon and/or boron. For example, the spacer material can include silicon oxide, silicon nitride, silicon oxynitride, SiBN, SiCN, SiOC, SiOCN, SiBCN, or any combination thereof.

In FIG. 2, known fabrication processes have been used to form a contact recess 250 in the top S/D structure 125. Wet etch processes can be used to form the recess 250, for example, potassium hydroxide (KOH), ammonium hydroxide (ammonia), tetramethylammonium hydroxide (TMAH), hydrazine, or ethylene diamine pyrocatechol (EDP), or any combination thereof. According to embodiments of the invention, an ammonia etch can be used to form the recess 250 in the top S/D structure 125. The ammonia etch is self-limiting, meaning that it will stop etching the top S/D structure 125 once the 11111 planes are formed. FIG. 2 is a cross-sectional view of the recess 250 having V-shape after performing an ammonia etch to form the V-shaped recess 250 in the top S/D structure 125.

Figure 3:
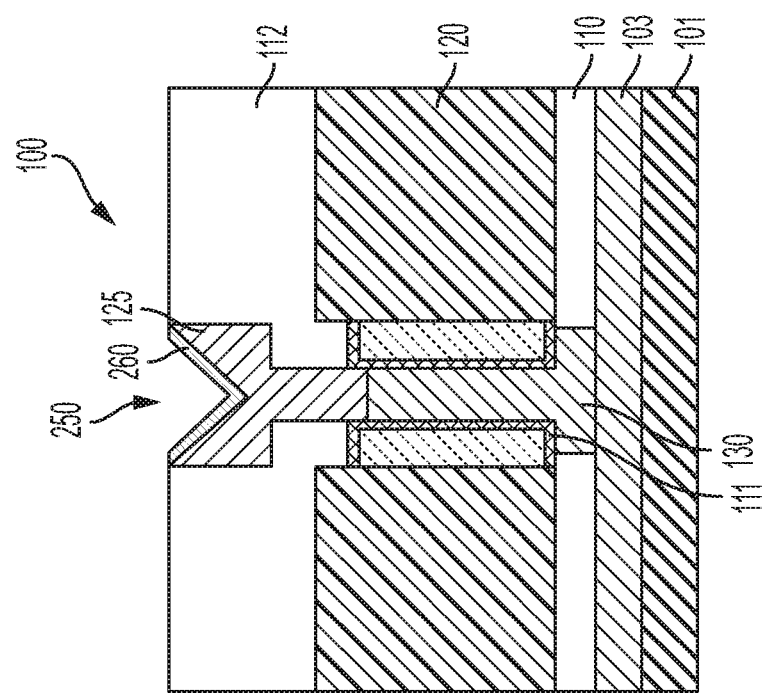

In FIG. 3, a silicide layer 260 is formed on a top surface of the S/D structure 125 in the contact recess 250 by known fabrication processes, for example, by performing a transition metal layer deposition process and/or an activation processing process. The top S/D structure 125 can serve as a silicon providing layer for forming the silicide layer 260. The silicide layer 260 can include nickel silicide, platinum-nickel silicide or the like.

Figure 4:
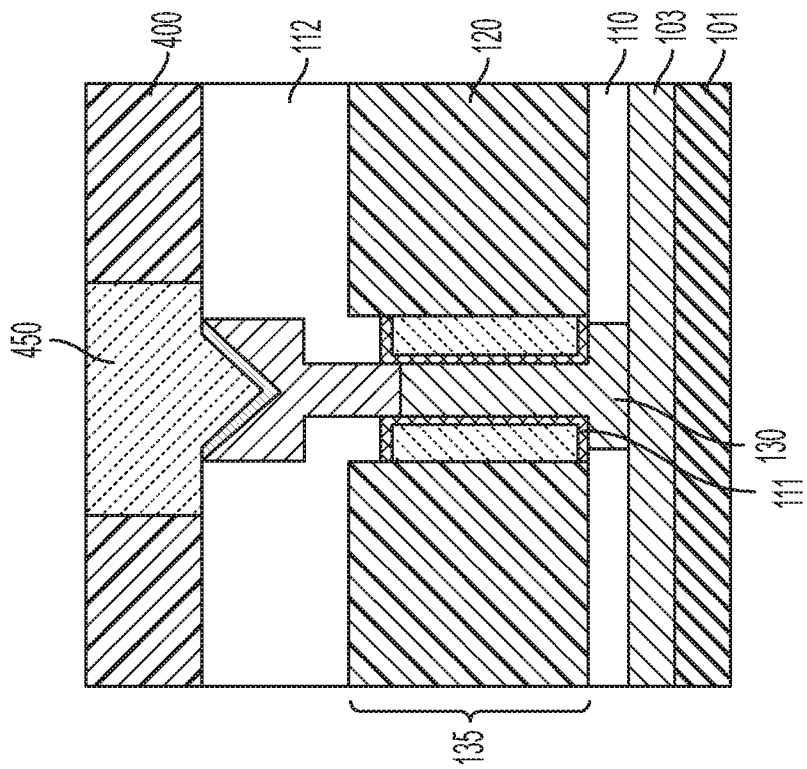

FIG. 4, illustrates a cross-sectional view of the structure 100 after forming an interlayer dielectric (ILD) 400 on the second gate spacer 112. Any known fabrication processes of forming the ILD 400 can be used, for example, a spin-on coating operation. The ILD 400 can be any suitable material, such as, for example, an oxide, silicon dioxide (SiO2) or the like. The ILD 400 can be of the same material as the second gate spacer 112.

A contact 450 is formed in the contact recess 250 on the top S/D structure 125 (as shown in FIG. 4) by any known process. The contact 450 can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

FIG. 4 illustrates the final structure 100 according to embodiments of the present invention that provides for increased contact surface area between the contact 450 and the top S/D structure 125 due to the V-shaped recess region 250 in the top S/D structure 125, and thereby reducing contact resistance of the final device.

Figure 5:
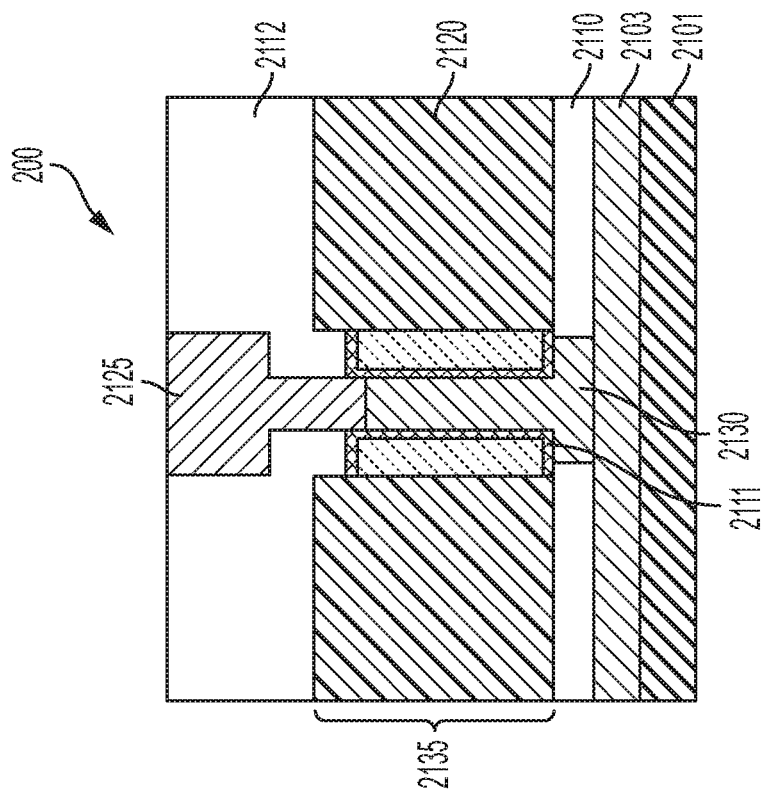

FIGS. 5-9 depict cross-sectional views of a semiconductor structure 200 after fabrication operations for forming a device having a M-shaped contact surface area in accordance with aspects of the invention. FIG. 5 depicts a cross-sectional view of the structure 200 that results from performing initial fabrication operations according to embodiments of the invention. More specifically, after performing initial fabrication operations, the resulting semiconductor structure 200 has a semiconductor substrate 2101 with a bottom S/D structure 2103 formed on top of the semiconductor substrate 2101. A fin 2130 (channel) extends vertically from the bottom S/D structure 2103 and is surrounded by a gate stack 2135. The fin 2130 can include a hard mask (not shown) on top of the fin 2130 formed by any known semiconductor fabrication method. The gate stack 2135 includes a metal gate 2120. The gate stack 2135 can also include a dielectric layer 2111 made of, for example, a high-k dielectric. Gate spacers 2110, 2112 are formed on opposing sides of the gate 2120. The first gate spacer 110 is formed between the gate stack 135 and the bottom S/D structure 103. The second gate spacer 2112 is arranged on top of the gate stack 2135. The first gate spacer 110 and the second gate spacer 112 can include any suitable dielectric material or a combination of multiple dielectric materials. The spacer material can include silicon, oxygen, nitrogen, carbon and/or boron. For example, the spacer material can include silicon oxide, silicon nitride, silicon oxynitride, SiBN, SiCN, SiOC, SiOCN, SiBCN, or any combination thereof. A top S/D structure 2125 can be formed by known fabrication operations, for example, in-situ doped epitaxial processing.

Figure 6:
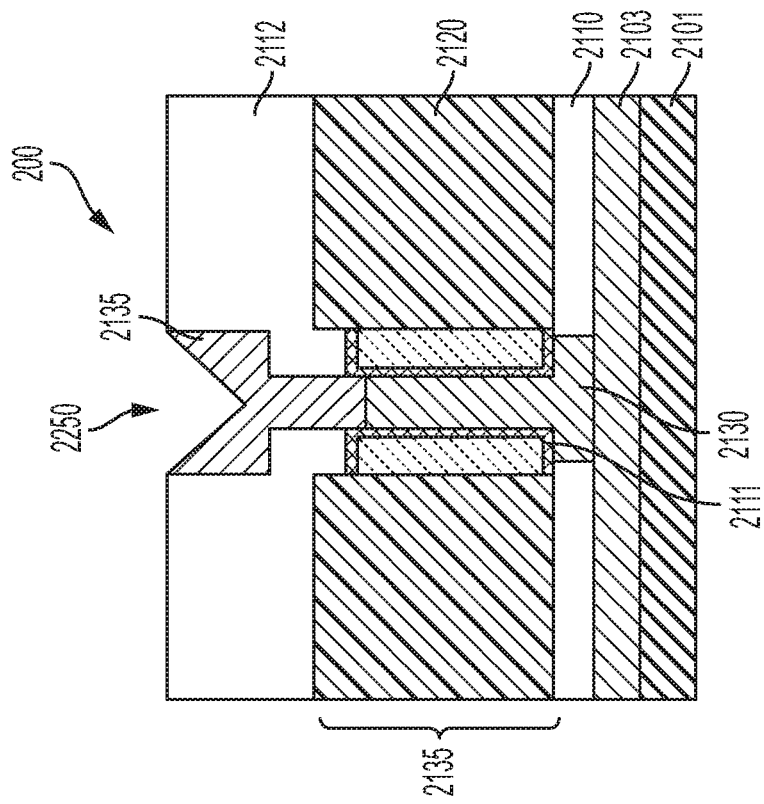

In FIG. 6 known fabrication processes have been used to form a contact recess 2250 on the top S/D structure 2125. Wet etch processes can be used to form the recess 2250, for example, potassium hydroxide (KOH), ammonium hydroxide (ammonia), tetramethylammonium hydroxide (TMAH), hydrazine, or ethylene diamine pyrocatechol (EDP), or any combination thereof. According to embodiments of the invention, a self-limiting ammonia etch can be used to form the recess 2250 in the top S/D structure 125. FIG. 6 is a cross-sectional view of the recess 2250 having V-shape after performing an ammonia etch to form the V-shaped recess 2250 in the top S/D structure 125.

Figure 7:
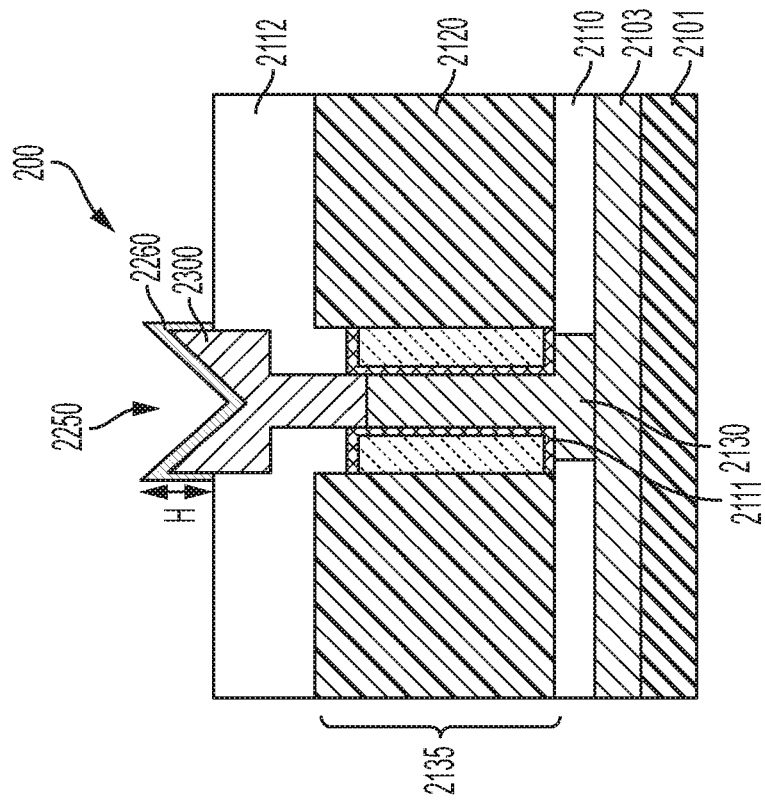

In FIG. 7, the second gate spacer 2112 has been recessed by a height (H) to form an S/D structure 2300 having M-shape. The second gate spacer 2112 can be recessed by any known semiconductor fabrication process, for example, etching.

Figure 8:
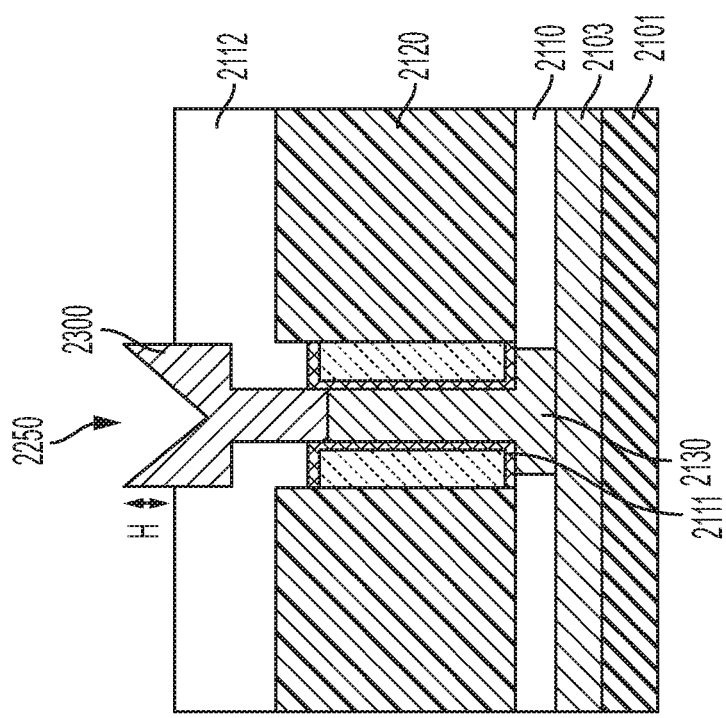

In FIG. 8, a silicide layer 2260 is formed on a top surface of the S/D structure 2300 by known fabrication processes, for example, by performing a transition metal layer deposition process and/or an activation processing process. The S/D structure 2300 can serve as a silicon providing layer for forming the silicide layer 2260. The silicide layer 2260 can include nickel silicide, platinum-nickel silicide or the like.

Figure 9:
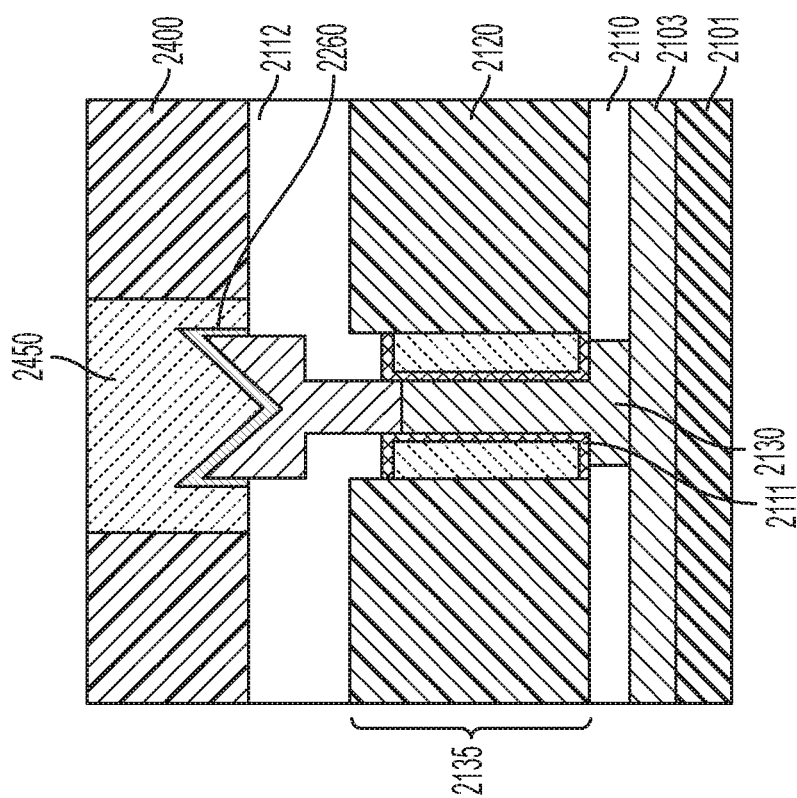

In FIG. 9, ILD 2400 is formed on the second gate spacer 2112. Any known fabrication processes of forming the ILD 2400 can be used, for example, a spin-on coating operation. The ILD 2400 can be any suitable material, such as, for example, an oxide, silicon dioxide (SiO2) or the like. The ILD 2400 can be of the same material as the second gate spacer 2112. Next a contact 2450 is formed on top of the S/D structure 2300 and silicide layer (as shown in FIG. 9) by any known process.

FIG. 9 illustrates the final structure 200 according to embodiments of the present invention that provides for increased contact surface area between the contact 2450 and the S/D structure 2300 due to the M-shape of the top of the S/D structure 2300, thereby reducing contact resistance of the final device.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   forming a substrate;
   forming a bottom source or drain (S/D) structure on the substrate;
   forming a fin extending from the bottom S/D structure;
   forming a gate around the fin;
   forming a top S/D structure on top of the fin,
   forming a recessed top S/D surface in the top S/D structure, the recessed top S/D surface recessed with respect to a dielectric layer;

recessing the dielectric layer to expose sidewalls and the recessed top S/D surface of the top S/D structure;

forming a silicide layer on the exposed sidewalls and the recessed top S/D surface;

forming a contact that is communicatively coupled to a surface of the silicide layer of the recessed top S/D surface of the top S/D structure.

2. The method according to claim 1, wherein the recessed top S/D surface is formed by an ammonia self-limiting etch.

3. The method according to claim 1, wherein the recessed top S/D surface has V-shape.

4. The method according to claim 1 further comprising forming a bottom spacer.

5. The method according to claim 4, wherein the dielectric layer comprises a top spacer, wherein the top S/D structure comprises an M-shape.

6. The method according to claim 5 further comprising depositing an interlayer dielectric (ILD) region on the top spacer.

7. A method of fabricating a semiconductor device, the method comprising:

forming a substrate; and forming a vertical field effect transistor (VFET) on top of the substrate, the VFET comprising:

a top source or drain (S/D) structure formed on top of a fin channel, wherein the top S/D structure comprises a V-shape top S/D surface that is raised with respect to a top spacer;

a silicide in direct contact with the V-shape top S/D surface and sidewalls of the top S/D structure such that the silicide comprises an M-shape; and a contact communicatively coupled to a surface of the M-shape silicide.

8. The method according to claim 7, wherein the silicide layer comprises nickel silicide.

9. The method according to claim 7, wherein the VFET further comprises a gate around the fin channel.

10. A method according to claim 7, wherein the substrate comprises a dopant.

11. The method according to claim 7, wherein the VFET further comprises a bottom spacer.

12. The method according to claim 11, further comprising recessing the top spacer.

13. The method according to claim 12 further comprising depositing an interlayer dielectric (ILD) region on top of the top spacer.

14. The method according to claim 7, wherein the V-shape recessed top S/D surface is formed by an ammonia self-limiting etch.

* * * * *